United States Patent
Urushihata

(10) Patent No.: US 8,399,970 B2
(45) Date of Patent: Mar. 19, 2013

(54) SEMICONDUCTOR DEVICE ATTACHED TO ISLAND HAVING PROTRUSION

(75) Inventor: Hiroyoshi Urushihata, Iruma (JP)

(73) Assignee: ON Semiconductor Trading, Ltd., Hamilton (BE)

(*) Notice: Subject to any disclaimer, the term of this patent is extended or adjusted under 35 U.S.C. 154(b) by 0 days.

(21) Appl. No.: 13/171,944

(22) Filed: Jun. 29, 2011

(65) Prior Publication Data
US 2011/0316135 A1 Dec. 29, 2011

(30) Foreign Application Priority Data
Jun. 29, 2010 (JP) ................................. 2010-148092

(51) Int. Cl.
*H01L 23/495* (2006.01)
*H01L 21/58* (2006.01)

(52) U.S. Cl. ......... 257/676; 257/E23.031; 257/E21.505; 257/E21.595; 257/E23.037; 257/666; 257/784; 257/686; 257/685; 257/777; 257/723

(58) Field of Classification Search .................. 257/676, 257/E23.021, E21.595, E23.031, 666, 784, 257/696, 685, 777, 723, E23.037
See application file for complete search history.

(56) References Cited

U.S. PATENT DOCUMENTS

| | | | |
|---|---|---|---|
| 2008/0165386 A1* | 7/2008 | Harada et al. | 358/1.16 |
| 2009/0189261 A1* | 7/2009 | Lim et al. | 257/676 |
| 2010/0105174 A1* | 4/2010 | Muto et al. | 438/123 |
| 2010/0289127 A1* | 11/2010 | Kanazawa et al. | 257/666 |
| 2011/0163431 A1* | 7/2011 | Fujioka et al. | 257/676 |
| 2011/0163432 A1* | 7/2011 | Fujioka | 257/676 |
| 2012/0034742 A1* | 2/2012 | Muto et al. | 438/123 |

FOREIGN PATENT DOCUMENTS

| | | |
|---|---|---|
| JP | 2006-66622 | 3/2006 |
| JP | 2008-294384 | 12/2008 |

* cited by examiner

*Primary Examiner* — A O Williams
(74) *Attorney, Agent, or Firm* — Morrison & Foerster LLP

(57) ABSTRACT

When a metal ribbon is ultrasonic-bonded, a peripheral area of an island and hanging pins provided in the periphery of the island need to be clamped by use of clampers of a bonder to prevent the island from being lifted up. However, if no sufficiently-wide peripheral area of the island can be secured or no hinging pins can be provided due to the miniaturization of the device, there arises a problem that the island cannot be clamped. A protrusion, which protrudes toward a lead and has the same height as an end portion of the lead, is provided to an edge of the island opposed to the lead. Accordingly, when the protrusion and the end portion of the lead are simultaneously pressed by the damper, it is possible to prevent the island from being lifted up even when no hanging pin or no clamp area around the island is provided.

6 Claims, 8 Drawing Sheets

Prior Art

SEMICONDUCTOR DEVICE ATTACHED TO ISLAND HAVING PROTRUSION

This application claims priority from Japanese Patent Application Number JP 2010-148092 filed on Jun. 29, 2010, the content of which is incorporated herein by reference in its entirety.

BACKGROUND OF THE INVENTION

1. Field of the Invention

The present invention relates to a semiconductor device and a method of manufacturing the same. Particularly, the present invention relates to: a semiconductor device including a metal ribbon for connecting an electrode of a semiconductor element and a lead together; and a method of manufacturing the same.

2. Description of the Related Art

Descriptions will be provided for a conventional semiconductor device 100 while referring to FIGS. 9A and 9B. FIG. 9A is a plan view of the semiconductor device 100, and FIG. 9B is a plan view showing a part of a manufacturing process.

Referring to FIG. 9A, the conventional semiconductor device 100 includes: an island 101; a semiconductor element 103 fixedly bonded to the top surface of the island 101; leads 102; and a metal ribbon 105 for connecting the semiconductor element 103 and some of the leads 102 together. In addition, these components are integrally covered with a sealing resin, which is not illustrated.

An electrode 104 is provided on a principal surface of the semiconductor element 103. An end of the metal ribbon 105 is fixedly bonded to the electrode 104 by ultrasonic bonding. The other end of the metal ribbon 105 is fixedly bonded to the leads 102. Thereby, the electrode 104 of the semiconductor element 103 and the leads 102 are electrically connected to each other.

Referring to FIG. 9B, through the manufacturing process of the semiconductor device 100, an individually-diced semiconductor element 103 is fixedly bonded to the top of the island 101 of a lead frame 110, as well as the electrode 104 and the leads 102 are electrically connected to each other by a bonder.

In other words, once the metal ribbon 105 is ultrasonic-bonded to the electrode 104, a capillary supporting the metal ribbon 105 is moved toward the leads 102 to connect the metal ribbon 105 and the leads 102 together. The term "capillary" means a tool that supplies a metal ribbon. During this time, the metal ribbon 105 is fixedly bonded to the leads 102 with the leads 102 and hanging pins 115, which connect the lead frame 110 and the island 101 together, pressed down respectively by dampers 120 of the bonder, in order to prevent the island 101 from being lifted up as a result of the metal ribbon 105 being pulled by the movement of the capillary (see Japanese Patent Application Publication No. 2008-294384, for example).

The metal ribbon 105 is larger in size and harder than a metal thin wire. For this reason, when the capillary is moved toward the leads 102 after ultrasonic-bonding the metal ribbon 105 to the electrode 104, the metal ribbon 105 is pulled in conjunction with the movement, and the already-fixed island 101 is accordingly lifted up.

When the island 101 is lifted up, some problems occur. The problems include: deformation of the lead frame 110; and the impossibility of forming a bonding loop of the metal ribbon 105 in an appropriate shape although the bonding loop of the metal ribbon 105 is expected to be formed in an arch shape to prevent the semiconductor element 103 and the metal ribbon 105 from contacting each other.

In order to prevent the island 101 from being lifted up, the hanging pins 115, which are integrated with the island 101, needs to be clamped by use of the dampers 120 of the bonder (as shown in FIG. 9B). Otherwise, the island 101 needs to be directly clamped in a way that its marginal portion (peripheral area) T situated outside its portion where the semiconductor element 103 is placed is clamped by use of the dampers 120 of the bonder.

However, hanging pins 115 are not provided to all the lead frames 110. The hanging pins 115 are provided particularly in a case where the corresponding semiconductor elements 103 have a larger chip size to keep the degree of balance during the manufacturing process. On the other hand, as is often the case with semiconductor elements 103 for which the degree of balance does not matter because of, for example, their smaller chip size, no hanging pins 115 are provided to the corresponding lead frames 110 with the influence of the hanging pins on the moisture resistance and the like taken into consideration, because the hanging pins 115 are led out of the sealing resin and the like after a product completion.

In addition, because the size of the island 101 and the size of the semiconductor 103 become close to each other in response to the miniaturization of (the package size of) the semiconductor device 100, it is impossible to secure the peripheral area T of the island 101, which is large enough to be clamped by the dampers 120, in an area outside the semiconductor element 103.

A technique of drawing the back surface of the island 101 by vacuum suction for the purpose of preventing the island 101 from being lifted up may be conceived as an idea. However, in a case where the semiconductor device 100 (the island 101) is smaller in size, it is impossible to form holes for vacuum suction in the placement surface of the bonder, on which the island 101 is placed. Furthermore, even if the holes could be formed there, the suction force is insufficient because the area drawn by suction is too small, and it is accordingly impossible to prevent the island 101 from being lifted up.

BRIEF SUMMARY OF THE INVENTION

The invention provides a semiconductor device that includes a semiconductor element having an electrode disposed on the principal surface of the semiconductor element, an island to which the semiconductor element is attached, a first lead separated from the island so that, in plan view of the semiconductor device, an edge of the first lead faces an edge of the island, a first protrusion protruding, in the plan view, from the edge of the island toward an extrapolation of the edge of the first lead, and a metal ribbon having a first end attached to the electrode of the semiconductor element and a second end attached to the first lead.

The invention also provides a method of manufacturing a semiconductor device. The method includes providing a lead frame having an island and a first lead. The first lead is separated from the island so that, in plan view of the lead frame, an edge of the first lead faces an edge of the island. The lead frame also has a first protrusion protruding, in the plan view, from the edge of the island toward an extrapolation of the edge of the first lead. The method further includes holding down the first protrusion of the island using a damper, attaching a first end of a metal ribbon to an electrode of a semiconductor element disposed on the island of the lead frame while the first protrusion is being held down by the damper, and attaching a second end of the metal ribbon to the first lead.

DETAILED DESCRIPTION OF THE INVENTION

Figure 1A:
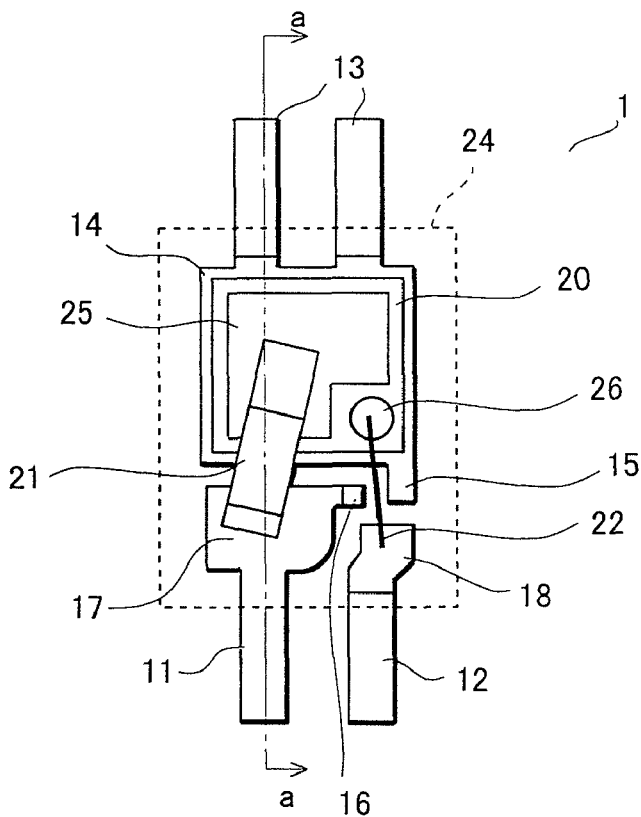
FIGS. 1A, 1B and 1C are respectively a plan view, a main-part enlarged view, and a cross-sectional view each for explaining a semiconductor device of a first embodiment of the present invention.

Detailed descriptions will be provided for the embodiments of the present invention while referring to FIGS. 1A to 8. FIGS. 1A, 1B and 1C are views showing a semiconductor device 1 of a first embodiment. FIG. 1A is a plan view of the semiconductor device 1; FIG. 1B is a main-part enlarged view of FIG. 1A; and FIG. 1C is a cross-sectional view taken along the line a-a of FIG. 1A.

Referring to FIG. 1A, the semiconductor device 1 includes a semiconductor element 20, an island 14, a first lead 11, a second lead 12, third leads 13, a protrusion 15, a metal ribbon 21 and a sealing resin 24.

A MOSFET (Metal-Oxide Semiconductor Field Effect Transistor), a bipolar transistor, an IGBT (Insulated Gate Bipolar Transistor), an IC (Integrated Circuit), a diode, or something similar may be used for the semiconductor element 20. Hereunder, the embodiments of the present invention will be clarified by giving an example in which an MOSFET is used for the semiconductor element 20. A source electrode 25 and a gate pad electrode 26 are provided on the principal surface (top surface) of the semiconductor element 20, and a drain electrode (not illustrated) is provided on the other principal surface (undersurface) of the semiconductor element 20. In a case where a bipolar transistor is used for the semiconductor element 20, a base electrode and an emitter electrode are provided on the principal surface of the semiconductor element 20, and a collector electrode is provided on the undersurface of the semiconductor element 20.

The source electrode 25 of the semiconductor element 20 is electrically connected to the first lead 11 via the metal ribbon 21. The metal ribbon 21 is, for example, an aluminum (Al) ribbon. A first end of the metal ribbon 21 is fixedly bonded to the source electrode 25 of the semiconductor element 20, and a second end of the metal ribbon 21 is fixedly bonded to a connecting portion 17 of the first lead 11. In addition, the gate pad electrode 26 of the semiconductor element 20 is connected to the second lead 12 via a metal thin wire (bonding wire) 22.

In a case where a discrete transistor is used for the semiconductor element 20, the first lead 11, the second lead 12, and the third lead 13 continuing to the back surface of the island 14 function as externally-connected terminals. As an example, in a case where the MOSFET is used for the semiconductor element 20, the first lead 11 is connected to the source electrode 25, the second lead 12 is connected to the gate pad electrode 26, and the island 14 is connected to the drain electrode.

The island 14, the first lead 11, the second lead 12 and the third lead 13 are provided there by etching or punch-processing a lead frame base material which is made of copper or a alloy raw material essentially containing copper. As an example, the island 14 is slightly larger than the semiconductor element 20 mounted on the top surface of the island 14. The first lead 11 and the second lead 12 are arranged opposed to the island 14 with space between the leads 11, 12 and the island 14. A first end of the first lead 11 and a first end of the second lead 12 are situated in the vicinity of the island 14. A second end of the first lead 11 and a second end of the second lead 12 are exposed to the outside of the sealing resin 24. The first end of the first lead 11, which is situated in the vicinity of the island 14, forms the connecting portion 17 which is wider than the rest of the first lead 11. A first end of the third lead 13 continues to the island 14, and a second end of the third lead 13 is led out of the sealing resin 24. The protrusion 15 is provided to a part of the island 14. A lead protrusion 16 is provided in a part of the connecting portion 17 of the first lead 11.

The second ends, respectively, of the first lead 11, the second lead 12 and the third lead 13, which are exposed to the outside through the lateral (side) surfaces of the sealing resin 24, are processed by folding. The first ends of the first lead 11 and the second lead 12 as well as the island 14 have the same height H above the second ends of the first lead 11 and the second lead 12 (see FIG. 1C). In other words, the principal surface Sf1 of the island 14, and the principal surfaces Sf2, Sf3 of the first lead 11 and the second lead 12, which are opposed to the island 14, are almost flush with one another. Referring to FIG. 1A again, the metal ribbon 21 is a ribbon-shaped wiring material, for example, with a thickness of approximately 0.1 mm and a width of approximately 1.0 mm, which is formed from an electrically-conductive material of aluminum or an alloy essentially containing aluminum. The metal ribbon 21 is thinner in thickness than, for example, a metal connection plate (clip) obtained by press-processing a metal plate. The metal ribbon 21 is furnished each time, from an elongated ribbon-shaped material beforehand supplied to a bonder, a necessary length of the material is fed and cut by a capillary. In other words, like a usual metal thin wire, the metal ribbon 21 can connect the semiconductor element 20 and the first lead 11 together, while forming a bonding loop shaped like an arch, for example. The first end of the metal ribbon 21 is bonded to the source electrode 25 of the semiconductor element 20, which is made of an aluminum material, by ultrasonic bonding. Instead, laser bonding may be used as a bonding method for the metal ribbon 21.

The second end of the metal ribbon 21 is fixedly bonded to the connecting portion 17 as an end portion of the first lead 11, through which copper as the lead frame base material is exposed to the outside, by ultrasonic bonding.

The metal ribbon 21 is larger in the area of the cross section orthogonal to the direction of the flow of an electric current than the metal thin wire with a diameter of approximately 0.5 mm. For this reason, resistance to the electric current in the connecting means can be made smaller, and current-carrying capacity of the connecting means can be accordingly made larger, when the metal ribbon 21 is used as the connecting means. For example, in the case where the MOSFET is used for the semiconductor element 20, the connection of the source electrode 25 to the first lead 11 via the metal ribbon 21 makes it possible to reduce the ON resistance.

In addition, the metal ribbon 21 is bonded to the semiconductor element 20 and the first lead 11 in a way that its bonded parts are shaped like a surface. This mode of bonding makes it easy to perform heat conduction. Heat produced from the semiconductor element 20 can be conducted and released to the outside via the metal ribbon 21 and the first lead 11 satisfactorily. The sealing resin 24 has a function of covering the semiconductor element 20, the metal ribbon 21, the metal thin wire 22, the first lead 11, the second lead 12, the island 14 and the like en bloc, and mechanically supporting them as a whole. The material of the sealing resin 24 is made of a thermosetting resin or a thermoplastic resin. Granular or fibrous fillers may be mixed into the material of the sealing resin 24 for the purpose of enhancing the quality of heat release.

Figure 1B:
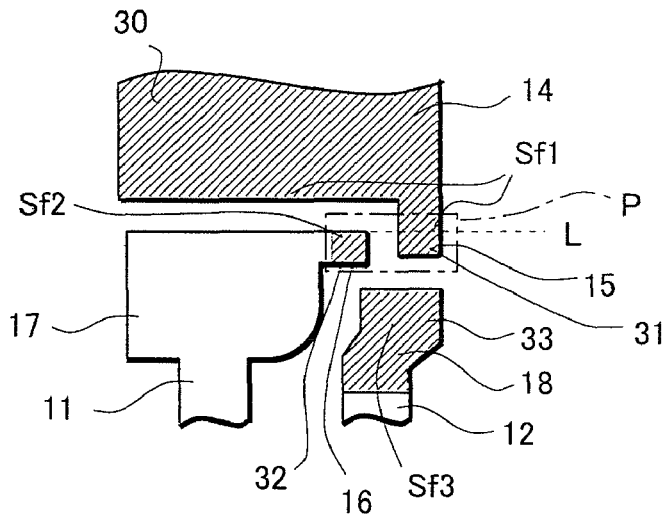

FIG. 1B is a main-part enlarged view showing the protrusion 15 and its vicinity. In this embodiment, the island 14 is provided with the protrusion 15 which continues to the island 14. The protrusion 15 is formed in the same manner as is the island 14. The protrusion 15 is provided in a way to partially protrude from an edge of the island 14, which is opposed to the second lead 12, toward a connecting portion 18 of the second lead 12. The extremity of the protrusion 15 reaches a position beyond an extension line (indicated by the dashed line) of the edge of the first lead 11, which is opposed to the island 14.

Furthermore, an extremity portion of the connecting portion 17 of the first lead 11 is provided with a lead protrusion 16 which partially continues to the extremity portion. The lead protrusion 16 is formed in a way to extend from the extremity portion of the connecting portion 17 toward the extremity of the connecting portion 18 and the extremity of the protrusion 15 in parallel to the opposed edge of the island 14 between the connecting portion 18 and the island 14. In this respect, the distance between the second lead 12 and the island 14 is made longer by locating the connecting portion 18 in the extremity of the second lead 12 farther from the island 14 than ever before. Thereby, a space in which to place the protrusion 15 and the lead protrusion 16 is secured. In other words, the interval between the second lead 12 and the island 14 is larger than the interval between the first lead 11 and the island 14. It is desirable that, when the island 14, the protrusion 15, the connecting portion 17, the lead protrusion 16, the connecting portion 18 and the second lead 12 are formed from the lead frame base material with a uniform plate thickness by processing the lead frame base material, the island 14 and the protrusion 15 should be spaced out from the connecting portion 17 and the lead protrusion 16 with a minimum design dimension, and vice versa; the island 14 and the protrusion 15 should be spaced out from the connecting portion 18 of the second lead 12 with a minimum design dimension, vice versa; and the connecting portion 17 and the lead protrusion 16 should be spaced out from the connecting portion 18 and the second lead 12 with a minimum design dimension, vice versa.

Metal plated layers 30, 31, 32, 33 with a thickness of 3 μm to 10 μm, which are made of, for example, silver (Ag), are partially provided in places, which are hatched in the illustration, on the entire surface of the island 14, the surface of the protrusion 15, the surface of the connecting portion 18 of the second lead 12, and the surface of the lead protrusion 16, respectively, by electroplating. It should be noted, however, that when silver is selected for the metal plated layers, no metal plated layer 32 is formed on the surface of the connecting portion 17, to which the metal ribbon 21 is fixedly bonded, with the bonding strength between the metal (Al) ribbon 21 and the connecting portion 17 taken into consideration. In a case where palladium (Pd) is used instead of silver (Ag), the metal plated layers may be provided including the surface of the connecting portion 17. In this case, the metal ribbon 21 is fixedly bonded to the top of the Pd plated layer on the connecting portion 17.

Figure 1C:
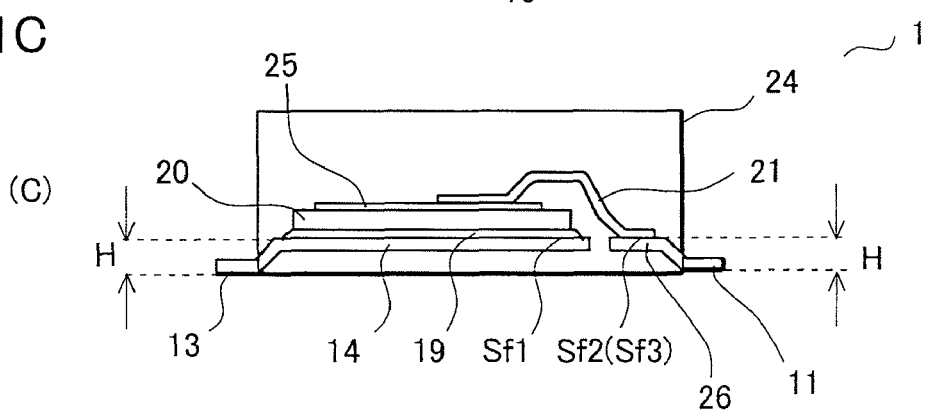

Referring to FIG. 1C, the undersurface of the semiconductor element 20 is fixedly bonded to the principal surface of the island 14 by use of an electrically-conductive fixedly-bonding agent 19 such as solder or Ag paste. In this respect, in a case where the undersurface of the semiconductor element 20 does not function as an electrode, the semiconductor element 20 may be fixedly bonded to the top surface of the island 14 by use of an electrically-insulating fixedly-bonding agent 19 essentially containing an epoxy resin or the like.

The first lead 11, the second lead 12 and the third lead 13 are processed by bending in a way that the island 14 and the connecting portion 17, 18 are buried in the resin 24. The principal surface Sf1 of the island 14, the surface of the protrusion 15, the surface of the connecting portion 17, the principal surface Sf2 of the lead protrusion 16, and the principal surface Sf3 of the connecting portion 18 of the second lead 12 are formed with the same height H. In a case where consideration is given to the film thicknesses of the metal plated layers 30, 31, 32, 33 made of Ag, the heights of the protrusion 15, the lead protrusion 16 and the connecting portion 18 are equal to one another, that is to say, are situated in the same plane, while the height of the surface of the connecting portion 17, on which no metal plated layer 32 is provided, is lower than the heights of the protrusion 15, the lead protrusion 16 and the connecting portion 18 by a thickness of the metal plated layer 32.

First of all, the metal ribbon 21 is bonded to the source electrode 25 of the semiconductor element 20 by ultrasonic bonding. Subsequently, the metal ribbon 21 is ribbon-bonded to the surface of the connecting portion 17 of the first lead 11 with a loop shape, which is illustrated in the drawing, formed by the capillary. During this, a press area P of the protrusion 15, which is indicated by the chain line shown in FIG. 1B, is pressed by (a projecting portion of) a damper of the bonder when the metal ribbon 21 is fixedly bonded to the electrode 25 (the source electrode 25) of the semiconductor element 20, and the first lead 11. Thereby, it is possible to prevent the island 14 from being lifted up when the metal ribbon 21 is bonded there.

Figure 9A:
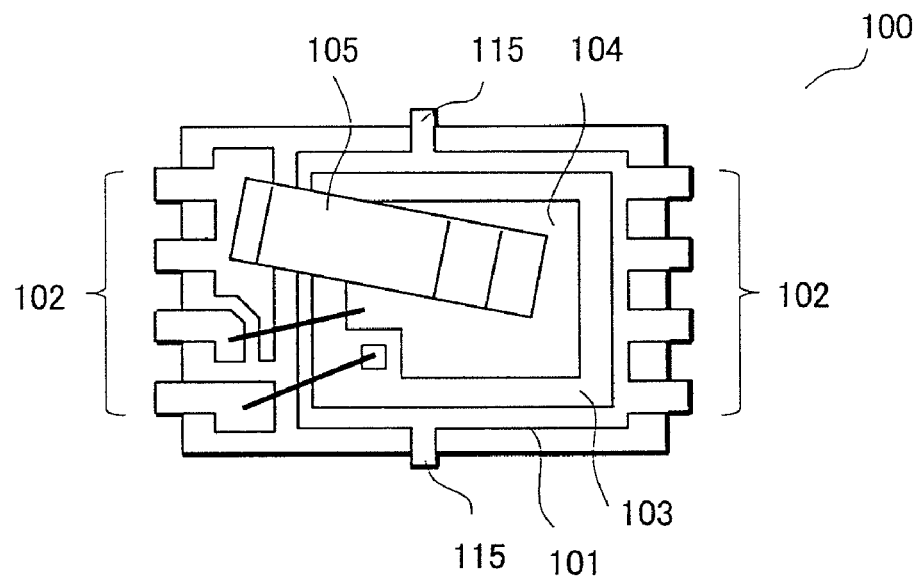
FIGS. 9A and 9B are plan views for explaining the prior art.
Figure 9B:
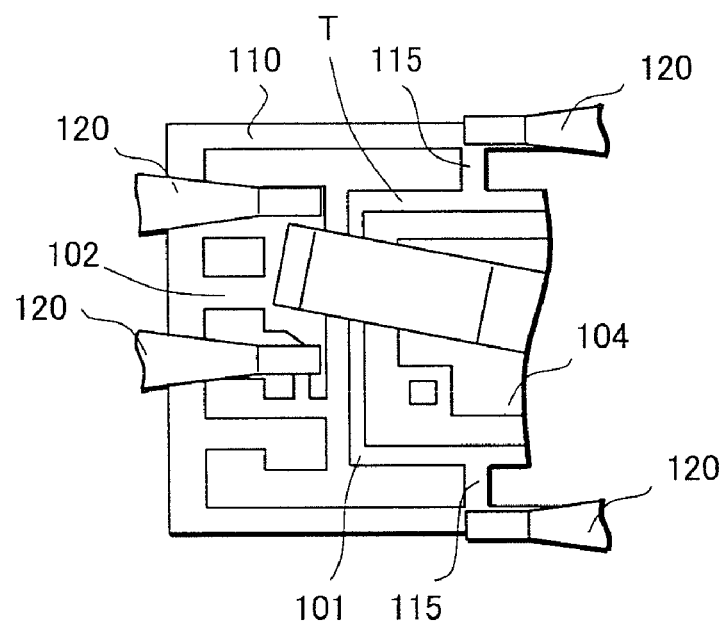

In this embodiment, the island 14 can be clamped by pressing the protrusion 15 which is protruded toward the first lead 11 even in case of a structure in which there is no hanging pins 115 in the island 14 or no sufficient room being clamped by the damper in the peripheral area T of the island (see FIG. 9).

In addition, simultaneously, the lead protrusion 16 can be clamped by the projecting portion of the damper which is in the process of pressing down the protrusion 15, in the case where the lead protrusion 16 extending from the extremity of the lead 11, to which the second end of the metal ribbon 21 is connected in the vicinity of the protrusion 15, toward the protrusion 15 is provided. This makes it possible to firmly fix the connecting portion 17 of the first lead 11. Accordingly, it is possible to prevent a phenomenon in which ultrasonic vibration energy to be applied to the metal ribbon 21 from the capillary escapes, and to fixedly bond the metal ribbon 21 to the first lead 11 stably as well. If the adhesion of the metal ribbon 21 is sufficient, the configuration may be adopted which includes the protrusion 15, but omits the lead protrusion 16.

The metal plated layers 31, 32 need not be provided to the surface of the protrusion 15, or the principal surface of the lead protrusion 16, as long as the prevention of the island 14 from being lifted up is the one and only purpose. However, the metal plated layer 33 (hatched) needs to be provided to the surface of the connecting portion 18 of the second lead 12 which is placed in the vicinity of the protrusion 15 and the lead protrusion 16 in consideration of the adhesive property of the metal thin wire (for example, a gold (Au) wire) 22, which is bonded to the surface of the connecting portion 18. For this reason, it is desirable that the metal plated layers 31, 32 should be provided to the principal surfaces of the protrusion 15 and the lead protrusion 16 which are situated in the vicinity of the connecting portion 18.

This will be described hereinbelow.

Referring to FIG. 1B again, the projecting portion of the damper presses the press area P (indicated by the chain line), in which the protrusion 15 and the lead protrusion 16 are placed, en bloc. This area is a minimum area, and requires a strict precision for the alignment of the projecting portion. In other words, if a position which the projecting portion clamps deviates, for example, the extremity of the second lead 12 may be pressed. In this case, if the principal surfaces of the protrusion 15 and the lead protrusion 16 would remain in the same condition as the lead frame base material (for example, a copper frame), the heights of the protrusion 15 and the lead protrusion 16 would be different from the height of the extremity of the second lead 12 on which the metal plated layer 33 is provided, and the protrusion 15 and the lead protrusion 16 would be accordingly insufficiently clamped by the projecting portion.

In this embodiment, the metal plated layers 31, 32, whose film thickness is equal to that of the metal plated layer 33 of the second lead 12, are provided to the protrusion 15 of the island 14 and the lead protrusion 16, respectively. Thereby, the protrusion 15 and the lead protrusion 16 can be securely clamped even in a case where the position which the projecting portion clamps deviates to the second lead 12 for the metal thin wire.

It should be noted that, if palladium (Pd) is used for the metal plated layers, it suffices that the entire surfaces of the main parts including the connecting portion 17 are provided with their respective metal plated layers, because sufficient strength can be obtained for the property of adhesion to the metal (Al) ribbon 21, the property of adhesion to the metal (Au) thin wire, and the property of adhesion to the semiconductor element 20. What is important is that the metal plated layers are provided to the respective surfaces in a way that, in consideration of the film thicknesses of the metal plated layers, the connecting portion 18 and the protrusion 15 (including the lead protrusion 16 depending on the case) are kept at the same certain height with no step formed between the connecting portion 18 and the protrusion 15.

It should be further noted that, although the first lead 11, to which the second end of the metal ribbon 21 is connected, has been shown by the example in which the single pin is led out to the outside, the first lead 11 in which multiple pins are led out from the single connecting portion 17 may be used instead.

Figure 2:
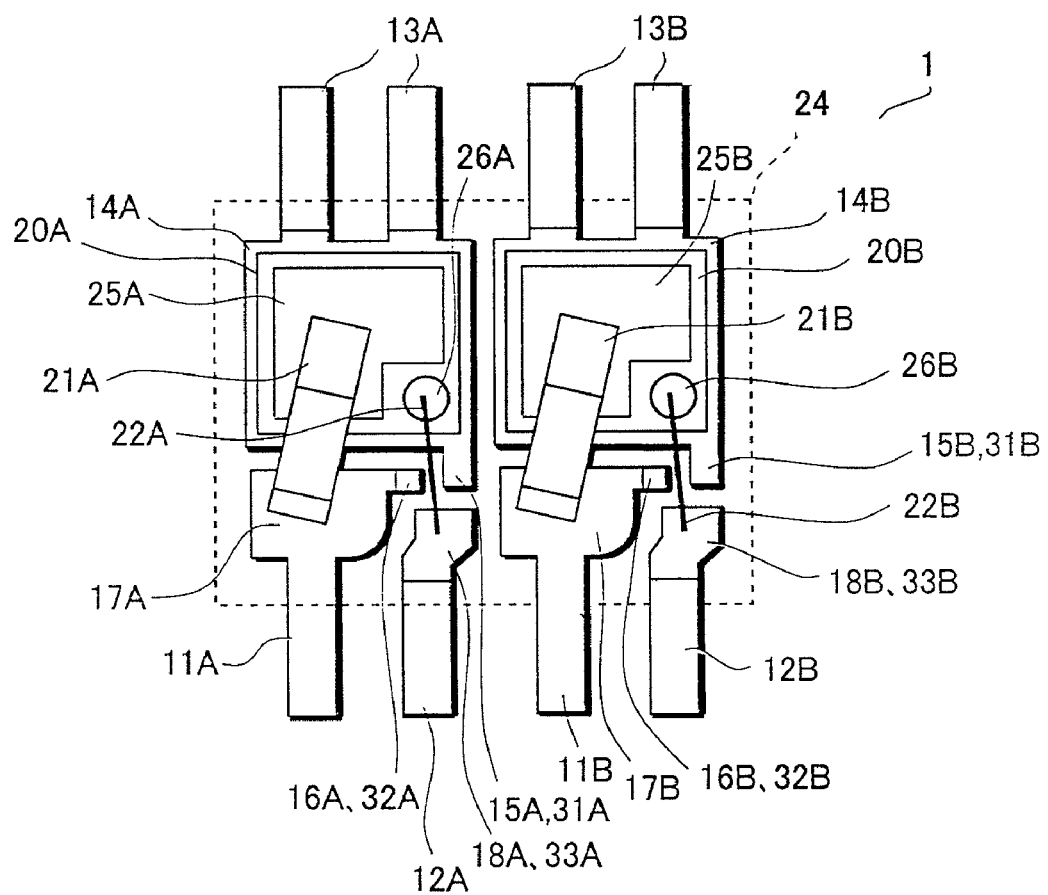
FIG. 2 is a plan view for explaining a semiconductor device of a second embodiment of the present invention.
Figure 3:
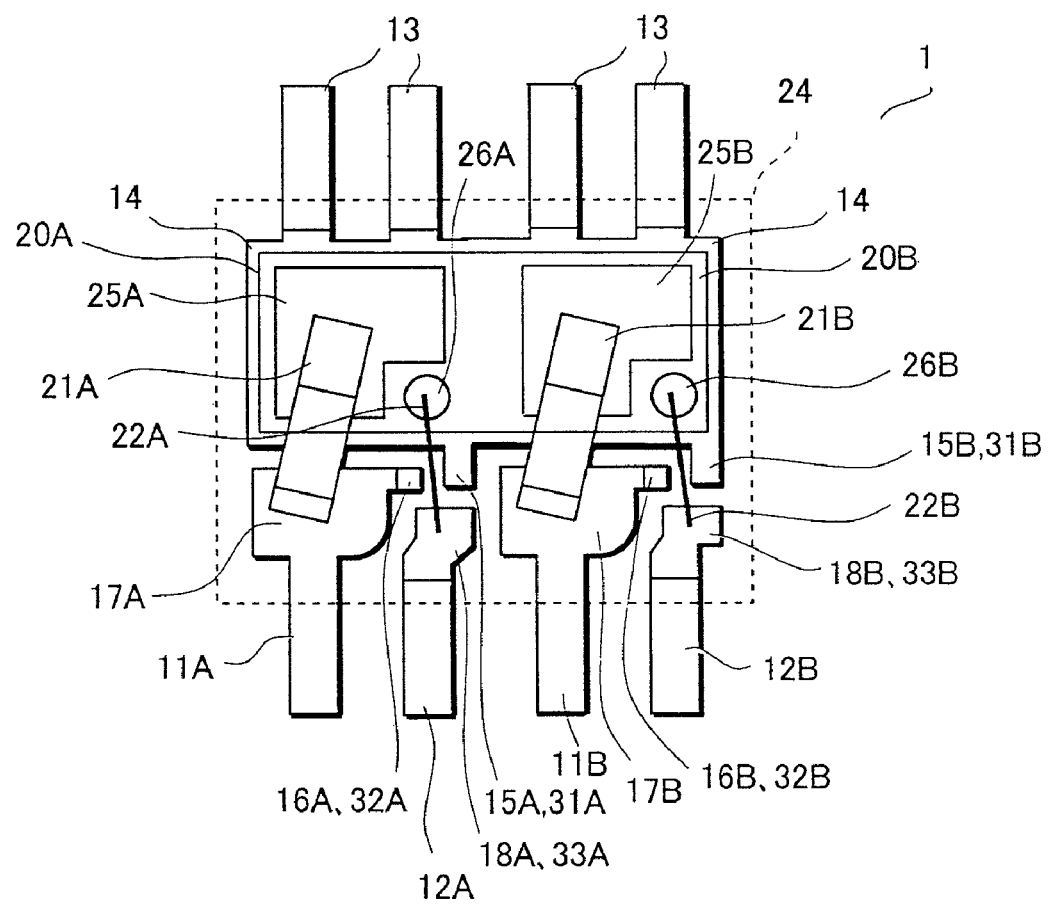
FIG. 3 is a plan view for explaining a semiconductor device of a third embodiment of the present invention.

Descriptions will be provided for the other embodiments while referring to FIGS. 2 and 3. FIG. 2 is a plan view showing a second embodiment of the present invention, and FIG. 3 is a plan view showing a third embodiment of the present invention.

FIG. 2 shows an example in which two semiconductor elements 20A, 20B are mounted inside a single resin 24.

The two semiconductor elements 20A, 20B are fixedly bonded to principal surfaces of islands 14A, 14B which are provided with protrusions 15A, 15B, respectively. First leads 11A, 11B are placed opposed to the islands 14A, 14B, respectively. Lead protrusions 16A, 16B are provided to extremities of the first leads 11A, 11B, respectively. Metal plated layers 31A, 31B, 32A, 32B with the same film thickness are provided to principal surfaces of the protrusions 15A, 15B and the lead protrusions 16A, 16B, respectively.

Metal ribbons 21A, 21B connect the semiconductor elements 20A, 20B to the corresponding first leads 11A, 11B, respectively.

In addition, the second leads 12A, 12B are provided to the corresponding the islands 14A, 14B respectively. Connecting portions 18A, 18B of the second leads 12A, 12B are provided with metal plated layers 33A, 33B on the surface thereof, respectively. The connecting portions 18A, 18B are connected to the semiconductor elements 20A, 20B by metal thin wires 22A, 22B, respectively.

In the case where, as described above, the multiple metal ribbons 21A, 21B are provided in the single package, one protrusion 15A (15B) is provided for one metal ribbon 21A (21B). That is because the metal ribbons 21A, 21B are bonded for the respective sets. In other words, when the metal ribbon 21A is fixedly bonded to the semiconductor element 20A and the first lead 11A in a first set (a left set in FIG. 2), the corresponding protrusion 15A and the corresponding lead protrusion 16A are pressed by a projecting portion of a damper. Subsequently, when the metal ribbon 21B is fixedly bonded to the semiconductor element 20B and the first lead 11B in a second set (a right set in FIG. 2), the corresponding protrusion 15B and the corresponding lead protrusion 16B are pressed by the projecting portion of the damper.

FIG. 3 shows a configuration used when the two semiconductor elements 20A, 20B are formed in a single chip by use of the configuration shown in FIG. 2. The configuration shown in FIG. 3 is the same as the configuration shown in FIG. 2, except that the two protrusions 15A, 15B are provided to a single island 14. A semiconductor element 20 on the island 14 may be made as the single chip (common substrate) in which the two element regions each made of, for example, a MOSFET are formed, or as two chips in which the respective element regions each made of, for example, a MOSFET are formed. In any one of the two cases, two electrodes (for example, source electrodes) 25A, 25B are provided on the surface of the semiconductor element 20, and the metal ribbons 21A, 21B are connected to the two respective electrodes 25A, 25B.

In other words, in this case, one protrusion 15A (15B) is provided for one metal ribbon 21A (21B) in the single package (sealing resin 24) as well.

Next, referring to FIGS. 4 to 8, descriptions will be provided for a method of manufacturing a semiconductor device using the configuration shown in FIG. 3 as an example.

Figure 4:
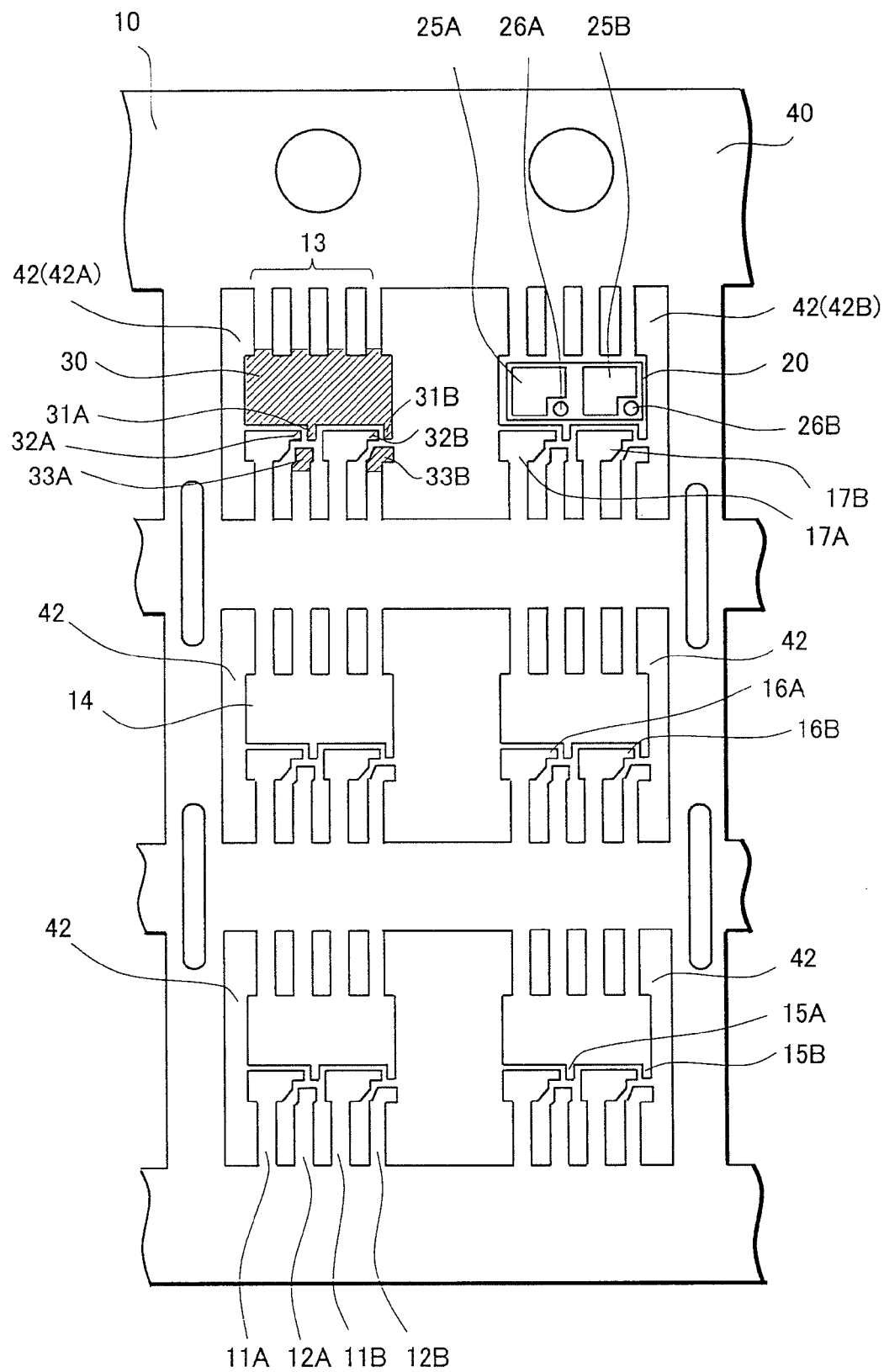
FIG. 4 is a plan view for explaining a method of manufacturing a semiconductor device of the present invention.

FIG. 4 is a diagram showing a part of a lead frame 10.

First of all, the lead frame 10 having a predetermined form is prepared. The lead frame 10 is a plate-shaped material with a plate thickness of, for example, approximately 150 μm, which is made of copper, a copper alloy raw material or something similar. The external shape of the lead frame 10 is shaped like a rectangle. Metal plated layers (marked by the hatching) are selectively formed in desired places, which will be described later.

Multiple units 42 are formed inside a frame-shaped external frame 40 by processing a lead frame base material by etching or punching. In this respect, each unit 42 means an element unit constituting one semiconductor device 1 (sealed with one sealing resin 24), and the lead frame 10 of the semiconductor device 1 shown in FIG. 3 serves as an example of the unit 42. In FIG. 4, six units 42 connected to the frame-shaped external frame 40 are shown as an example. Incidentally, for facilitation of explanation, although FIG. 4 shows as if the multiple units 42 were different from one another in the configuration, the configurations described as follows are similar for all of the units 42.

One unit 42 is formed from one island 14, first leads 11A, 11B, second leads 12A, 12B, and third leads 13. The island 14 is large enough for a semiconductor 20 to be placed on the principal surface of the island 14. First ends, respectively, of the first leads 11A, 11B and the second leads 12A, 12B are arranged close to, and opposed to, the island 14. Second ends, respectively, of the first leads 11A, 11B and the second leads 12A, 12B continue to the external frame 40. In addition, first ends of the respective third leads 13 continue to the island 14. Second ends of the respective third leads 13 continue to the external frame 40. Furthermore, the first end portions of the respective first leads 11A, 11B, which are situated close to the island 14, are partially formed wider to form connecting portions 17A, 17B.

Protrusions 15A, 15B protruding toward the first leads 11A, 11B are provided to an edge of the island 14 which is opposed to the first leads 11A, 11B. Moreover, lead protrusions 16A, 16B protruding toward the protrusions 15A, 15B are provided to end portions of the first leads 11A, 11B, respectively.

Metal plated layers selectively formed before forming the island 14, the first leads 11A and the like are as follows. A metal plated layer 30 is formed on the entire surface of the island 14. Metal plated layers 31A, 31B are formed on the principal surfaces of the protrusions 15A, 15B as well. In addition, metal plated layers 32A, 32B, 33A, 33B are formed in the principal surfaces of the lead protrusions 16A, 16B, and the principal surfaces of connecting portions 18A, 18B of the second leads 12A, 12B as well. Incidentally, parts of the lead frame base material made of copper are exposed to the outside through the connecting portions 17A, 17B of the first leads 11A, 11B. The metal plated layers 30, 31A, 31B, 32A, 32B, 33A, 33B have the same thickness, and the thickness is 2 µm to 10 µm, for example (see a unit 42A).

Subsequently, the semiconductor element 20 is mounted on the top surface of the island 14 by use of a fixedly-bonding agent (not illustrated) (see a unit 42B). As described above, a MOSFET, a bipolar transistor, an IGBT, an IC, a diode or something similar is used for the semiconductor element 20. In this respect, as an example, a MOSFET is used for the semiconductor element 20. Source electrodes 25A, 25B and gate pad electrodes 26a, 26B are provided on the top surface of the semiconductor element 20. Drain electrodes are formed on the back surface of the semiconductor element 20. To put it more specifically, the semiconductor element 20 is formed, for example, by: arranging two element regions each made of the MOSFET on the common substrate (namely, a single chip) in the left-right direction in the plan view; providing the left element region with the source electrode 25A and the gate pad electrode 26A, which are connected to the left element region; and providing the right element region with the source electrode 25B and the gate pad electrode 26B, which are connected to the right element region. Even when two semiconductor elements 20A, 20B having the respective substrates (the respective two chips) are mounted on the single island 14, the semiconductor elements 20A, 20B are similarly formed.

In a plan view of the semiconductor element 20, a part of the semiconductor element 20 in which the left source electrode 25A is situated will be hereinafter referred to as a primary side of the semiconductor element 20, and another part of the semiconductor element 20 in which the right source electrode 25B is situated will be hereinafter referred to as a secondary side of the semiconductor element 20.

An electrically-conductive fixedly-bonding agent such as solder or electrically-conductive Ag paste, is used as the fixedly-bonding agent, in a case where the back surface of the semiconductor element 20 is used as an electrode. On the other hand, an electrically-insulating adhesive agent, such as an epoxy resin, may be used as the fixedly-bonding agent, in a case where the back surface of the semiconductor element 20 is not used as an electrode.

Referring to FIGS. 5 to 8, descriptions will be provided for the ensuing part of the bonding process. The lead frame 10 is aligned to a placement stage of a bonder (not illustrated) to perform wire bonding by use of the bonder.

During this time, parts of the lead frame 10 are clamped onto the surface of the placement stage by a damper 50 installed above the placement stage. In addition, the electrodes on the semiconductor element 20 are connected to the first leads 11A, 11B by use of the metal ribbons 21A, 21B.

Figure 5:
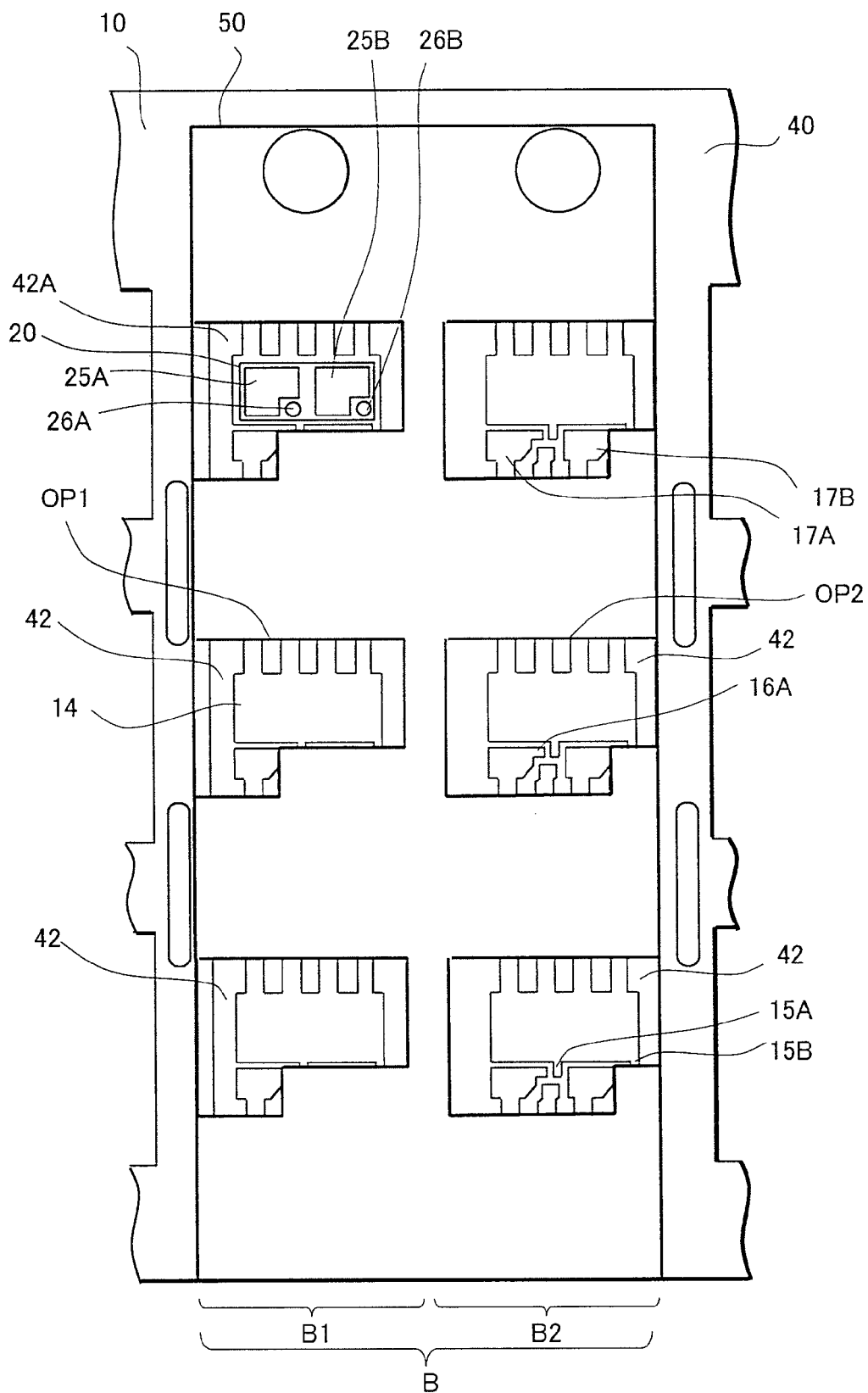
FIG. 5 is another plan view for explaining the method of manufacturing a semiconductor device of the present invention.
Figure 6:
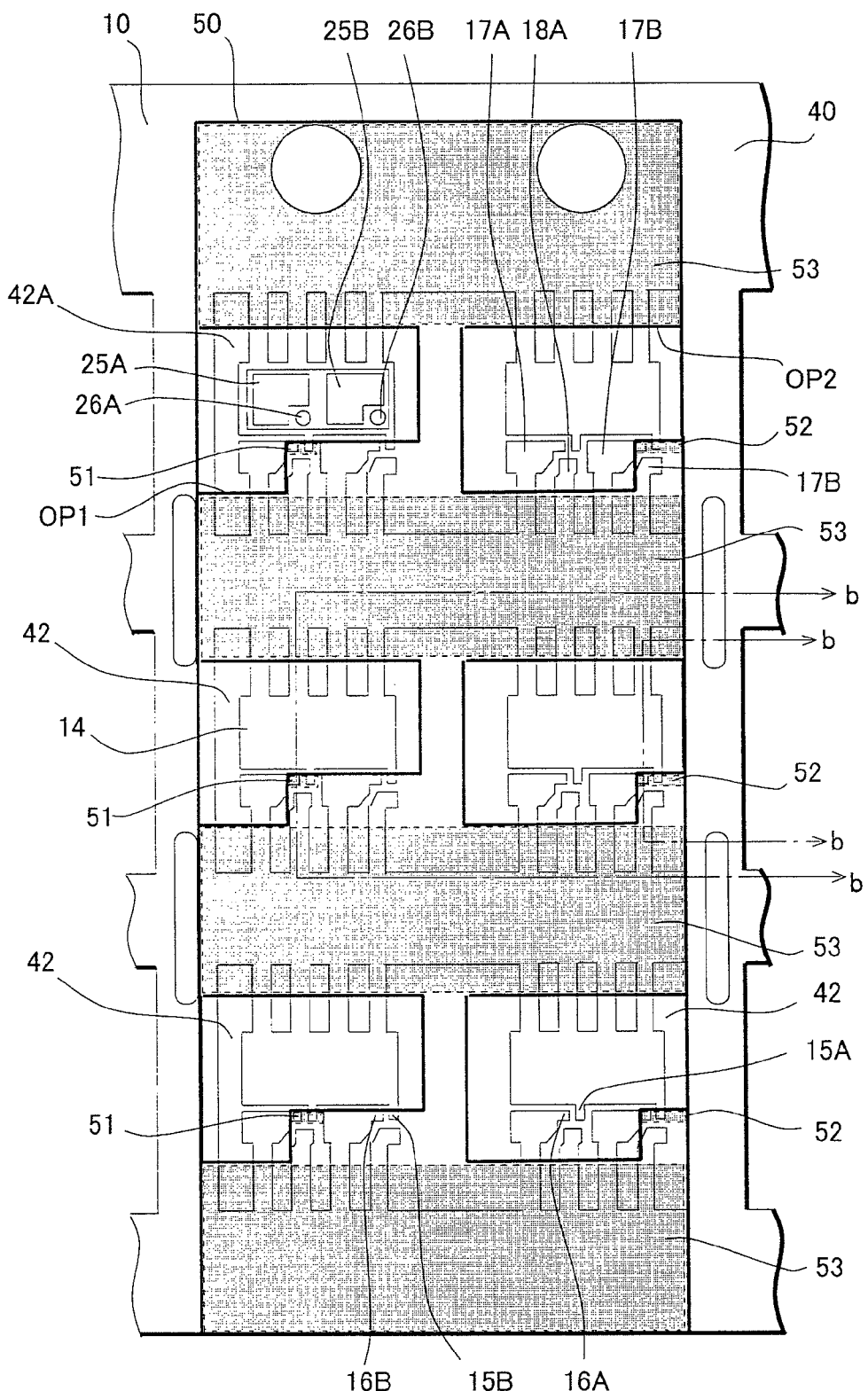
FIG. 6 is yet another plan view for explaining the method of manufacturing a semiconductor device of the present invention.
Figure 7:
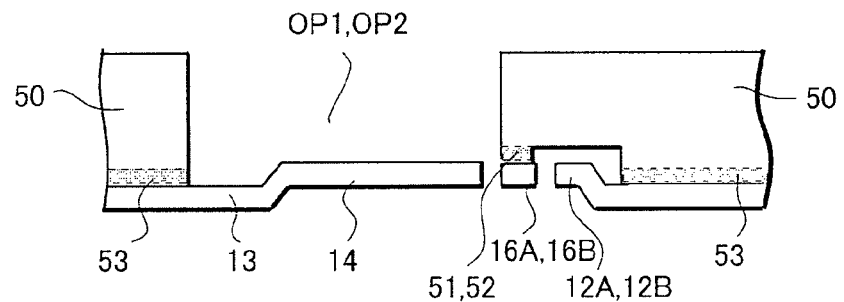
FIG. 7 is still another plan view for explaining the method of manufacturing a semiconductor device of the present invention.

Referring to FIGS. 5 to 7, descriptions will be provided for the damper 50. These are drawings showing a configuration of the damper 50. FIG. 5 is a plan view, viewed from above a mount surface (principal surface Sf1) of the semiconductor element on the island 14. FIG. 6 is a plan view showing a pattern in which projecting portions are provided in the damper 50. FIG. 7 is a cross-sectional view of the pattern taken along the b-b line of the FIG. 6, from which the semiconductor elements on the island 14 are omitted. In these drawings, the semiconductor element 20 is mounted in every unit 42 like in the unit 42A shown in FIG. 5.

FIGS. 5 and 6 show the damper 50 for clamping six units 42 en bloc as one block B. A column including three units 42 shown in the left half of FIG. 5 constitutes a first block B1, where the source electrode 25A and the first lead 11A in the primary side of the semiconductor element 20 are fixedly bonded together in each unit 42. In addition, the other column including three units 42 shown in the right half of FIG. 5 constitutes a second block B2, where the source electrode 25B and the first lead 11B on the secondary side of the same semiconductor 20 are fixedly bonded together in each unit 42.

First openings OP1, through each of which at least the source electrode 25A and the first lead 11A in the primary side thereof are exposed to the outside, are formed in the first block B1 of the damper 50. Ribbon boding is performed from above the damper 50 through each first opening OP1. First projecting portions 51 (hatched) projecting toward the lead frame 10 are provided in positions of portions of the damper 50 which overlap the protrusions 15A and the lead protrusions 16A in the lead frame 10, respectively (see FIGS. 6 and 7).

Second openings OP2, through each of which at least the source electrode 25B and the first lead 11B in the secondary side thereof are exposed to the outside, are formed in the second block B2 of the damper 50. Ribbon boding is performed from above the damper 50 through each second opening OP2. Second projecting portions 52 (hatched) projecting toward the lead frame 10 are provided in positions of portions of the damper 50 which overlap the protrusions 15B and the lead protrusions 16B in the lead frame 10, respectively (see FIGS. 6 and 7).

It should be noted that, as shown in FIGS. 6 and 7, the second ends of the first leads 11A, 11B, the second ends of the second leads 12A, 12B, and the second ends of the third leads 13 are pressed en bloc by third projecting portions 53, which are wider. In addition, the surface of the placement stage of the bonder is provided with steps so as to be in contact with the back surface of the lead frame 10 processed by folding. In other words, portions of the surface of the work stage on which the islands 14, the protrusions 15A, 15B and the extremity portions of the second leads 12A, 12B are placed is higher than portions of the surface of the work stage on which the first leads 11, the second leads 12 and the third leads 13 are placed. The height of the first projecting portions 51, the height of the second projecting portions 52 and the height of the third projecting portions 53 are differently set in accordance with the steps which are made when the lead frame is processed by folding.

Figure 8A:
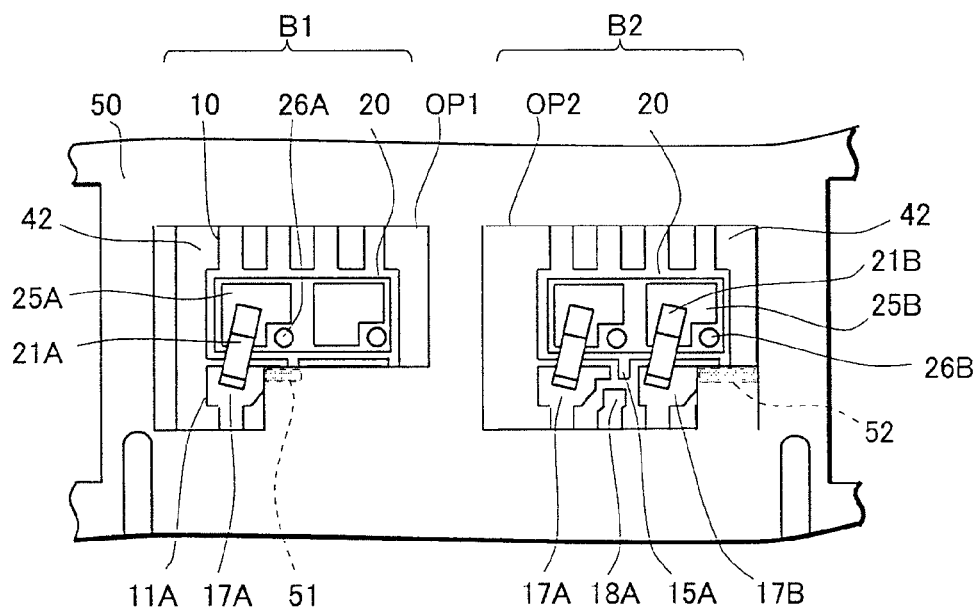
FIGS. 8A to 8C are the other plan views for explaining the method of manufacturing a semiconductor device of the present invention.
Figure 8B:
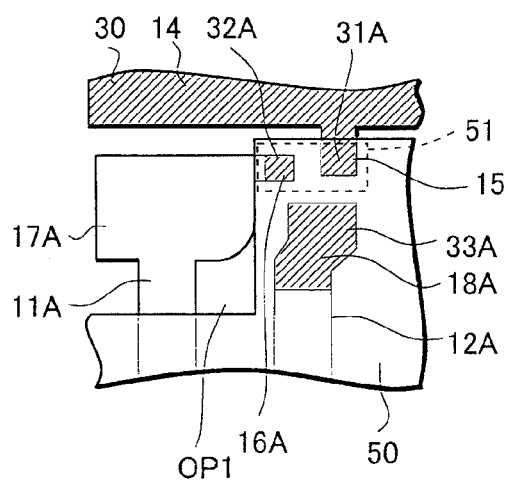
Figure 8C:
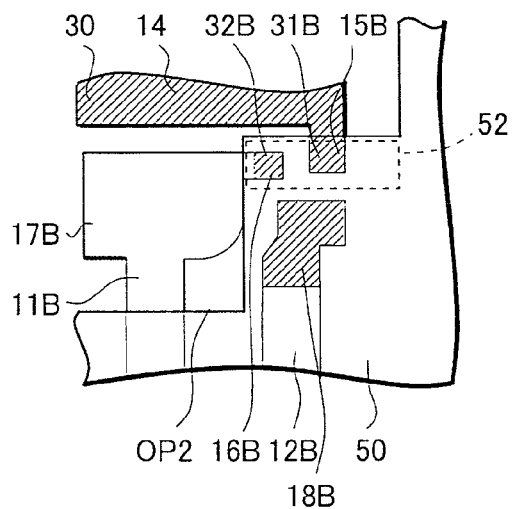

Referring to FIGS. 8A, 8B and 8C, descriptions will be provided for a process of bonding the metal ribbons 21A, 21B. FIG. 8A is a plan view showing a part of the first block B1 and a part of the second block B2. FIG. 8B is an enlarged view showing how the first projecting portion 51 presses down the protrusion 15A and the lead protrusion 16A in the first block B1. FIG. 8C is an enlarged view showing how the second projecting portion 52 presses down the protrusion 15B and the lead protrusion 16B in the second block B2.

When the damper 50 presses the lead frame 10, the first projecting portion 51 simultaneously presses the protrusion 15A and the lead protrusion 16A in the primary side of the first block B1, as well as the second projecting portion 52 simultaneously presses the protrusion 15B and the lead protrusion 16B in the secondary side of the second block B2. The protrusion 15A and the lead protrusions 16A as well as the protrusion 15B and the lead protrusion 16B are formed with the same height. In addition, the metal plated layers 31A, 32A, 31B, 32B with the same height are provided on the principal surfaces of the protrusion 15A, the lead protrusion 16A, the protrusion 15B and the lead protrusion 16B, respectively. For these reasons, the protrusion 15A and the lead protrusion 16A can be securely clamped by the projecting portion 51, while the protrusion 15B and the lead protrusion 16B can be securely clamped by the projecting portion 52. Even if the first projecting portion 51 or the second projecting portion 52 simultaneously presses down the connecting portion 18A or the connecting portion 18B due to a positional shift, the pressing force applied to the corresponding protrusion 15 and the corresponding lead protrusion 16 does not decrease because there is no height difference between the two. As an inert gas, for example, a nitrogen gas is injected from the damper 50 at a rate of 4 liters per minute.

While in this condition, a capillary (not illustrated) supporting the metal ribbon 21A is moved to the primary side of the semiconductor element 20, and the first end of the metal ribbon is ultrasonic-bonded (wedge-bonded) to the top of the source electrode 25A. Subsequently, the capillary is moved in order to form a desired bonding loop which is shaped like, for example, an arch; the second end of the metal ribbon 21A is fixedly ultrasonic-bonded to the top of the connecting portion 17A of the first lead 11A; and the metal ribbon 21A is cut. The connecting portion 17A can keep its quality of adhering to the metal ribbon 21A satisfactory because: no metal plated layer is provided on the connecting portion 17A; and the lead frame base material (copper) is accordingly exposed to the outside in the connecting portion 17A.

During this time, the first projecting portion 51 securely presses the protrusion 15A and the lead protrusion 16A in the primary side. For this reason, even in a case where no hanging pin or no clamp area around the island is provided, it is possible to prevent the island 14 from being lifted up while the capillary is moved toward the first lead 11A after the metal ribbon 21A is bonded to the source electrode 25A. In addition, the connecting portion 17A enables the ultrasonic energy from the capillary to be applied to its joining part without wasteful loss of the ultrasonic energy, and accordingly can obtain a secure bonding, because the lead protrusion 16A immediately around the connecting portion 17A can be pressed by the first projecting portion 51; and the first lead 11A can be fixed by the first projecting portion 51 and the third projecting portion 53 at two areas.

Once the bonding of the metal ribbon 21A is completed in the primary side of the semiconductor element 20, the lead frame 10 is moved horizontally. Subsequently, ribbon bonding is performed in the secondary side of the semiconductor element 20 like in the primary side thereof. In other words, the semiconductor element 20, in which the fixedly bonding of the metal ribbon 21A has been completed in the primary side, is exposed to the outside through the opening OP2, and thereby the ribbon bonding is performed for the secondary side.

A capillary (not illustrated) supporting the metal ribbon 21B is moved to the secondary side of the semiconductor element 20, and the first end of the metal ribbon 21B is ultrasonic-bonded to the top of the source electrode 25B. Subsequently, the capillary is moved in order to form a desired bonding loop which is shaped like, for example, an arc; the second end of the metal ribbon 21B is fixedly bonded to the top of the connecting portion 17B of the first lead 11B; and the metal ribbon 21B is cut.

During this time, the second projecting portion 52 securely presses the protrusion 15B and the lead protrusion 16B in the secondary side. For this reason, it is possible to prevent the island 14 from being lifted up while the capillary is moved toward the first lead 11B after the metal ribbon 21B is bonded to the source electrode 25B.

It should be noted that the metal ribbon bonding in the primary side and the metal ribbon bonding in the secondary side are performed in the respective units 42 in one block B at the same time.

Thereafter, the lead frame in which the bonding of the metal ribbons 21A, 21B have been complete is transferred to a wire bonder for a metal thin wire. As shown in FIG. 1, the gate pad electrode 26A and the second lead 12A are connected together by the metal thin wire (for example, a Au wire) 22 by using an already-known technique in the primary side, while the gate pad electrode 26B and the second lead 12B are similarly connected together by the metal thin wire 22 in the secondary side. The connection of each metal thin wire is performed, for example, by thermo-compression ball bonding. The metal thin wire 22 starts at the gate pad electrode 26 of the semiconductor element 20, passes over the protrusion 15 and the lead protrusion 16, as well as is bonded to the connecting portion 18 of the second lead 12.

Thereafter, resin sealing is performed to cover the semiconductor element 20 and the like by use of a mold. This mold includes an upper mold and a lower mold. A cavity into which the sealing resin is injected is formed by bringing the upper and lower molds in contact with each other. Transfer molding, injection molding or potting may be used as the resin sealing method. As the resin material, a thermosetting resin, such as an epoxy resin, can be used for the transfer molding. A thermoplastic resin, such as a polyimide resin or a polyphenylene sulfide, can be used for the injection molding.

Because this process is carried out by use of an already-known technique, descriptions will be provided for the process with the illustration omitted. The islands 14, on whose top surfaces the semiconductor elements 20 are respectively mounted, as well as the end portions of the first leads 11A, 11B and the second leads 12A, 12B, are stored in the cavity. Subsequently, the sealing resin is injected into the cavity through a gate provided in the mold. Thereby, the islands 14, the semiconductor elements 20, the metal ribbons 21A, 21B, the first leads 11A, 11B and the second leads 12A, 12B are sealed with the resin. The units 42 provided in the lead frame 10 are sealed with the resin en bloc at the same time.

Once the injection of the resin into the cavity is completed, the resin-sealed body is taken out of the mold. In the case where the resin used as the sealing resin is a thermosetting resin, a step of heat setting is required.

After that, the units 42 are separated from the lead frame 10 by punching, and the discrete semiconductor devices 1 are mounted on the respective mount substrates, for example. In addition, the surfaces of parts of the first leads 11A and the like, which are exposed from resin sealed body to the outside, are covered with plated films, such as solder-plated films, in order to prevent the oxidation of the first leads 11A and the like. Through the foregoing process, the semiconductor device 1 whose configuration is shown in FIG. 1 is manufactured.

The following effects are obtained from the present invention.

First, it is possible to prevent each island from being lifted up even in a case where no hanging pin or no clamp area around the island is provided, because the providing of the island with the protrusion protruding toward the corresponding lead enables the protrusion to be pressed by the damper.

In addition, the protrusion is not exposed to the outside because the protrusion is completely sealed with the sealing resin, although the protrusion protrudes toward the lead. Accordingly, it is possible to avoid deterioration in the breakdown voltage and moisture resistance of the semiconductor device, which would occur if the clamp area would be exposed to the outside through an end surface of the resin.

Second, it is possible to clamp the protrusion and the lead protrusion by use of one projecting portion of the damper at the same time, because the protrusion is protruded beyond the extremity of the lead to which the corresponding metal ribbon is fixedly bonded, and the extremity of the lead is provided with the lead protrusion as well.

In the conventional practice, the damper for clamping the leads clamps second ends of the respective leads (an area near the outer frame of the lead frame) en bloc. However, the conventional practice is insufficient for handling the lead to which the metal ribbon is bonded, and the metal ribbon cannot be stably bonded to the lead. In addition, the lead frame is not strong enough to withstand a force applied during the bonding of the metal ribbon. This deforms and damages the extremity (connecting portion) of the lead.

The present invention makes it possible to fixedly bond the metal ribbon stably to the lead because: the lead protrusion is provided to the extremity of the lead (the vicinity of the connecting portion to which the metal ribbon is connected); and the lead protrusion and the protrusion of the island can be clamped at the same time.

Third, the metal plated layers are provided, respectively, on the principal surface of the protrusion, and the end (fitst) portion (lead protrusion) of the lead which is pressed together with the protrusion by the damper. Thereby, it is possible to make the height of the protrusion and the height of the lead protrusion equal to each other. The protrusion of the island and the lead protrusion are pressed by (the projecting portion of) the single damper at the same time. The heights of the protrusion and the extremity of the lead which are pressed by the projecting portion of the damper need to be made equal to each other in order to prevent the island from being lifted up. The entire surface of the island, including the surface of the protrusion, is plated with the metal for the purpose of fixedly bonding the semiconductor element to the island, and the metal plated layer with the same film thickness is formed on the lead protrusion as well. Thereby, the height of the protrusion and the height of the lead protrusion can be made equal to each other.

It should be noted that the metal plated layer may be provided on the island, except for the protrusion. In this case, the lead protrusion need not be provided with its metal plated layer, either, for the purpose of making the height of the lead protrusion equal to the height of the protrusion.

Nevertheless, the other lead to which the metal thin wire is fixedly bonded is arranged in the vicinity of the protrusion, and the fixedly-bonding area in the extremity of the other lead, to which the metal thin wire is fixedly bonded, is plated with the metal in order to enhance its adhesiveness.

The protrusion and the lead protrusion which are pressed en bloc by the projecting portion of the damper represent a minimum area, and a higher precision is accordingly required for the clamp alignment. If a position of being pressed by the projecting portion deviates, the extremity of the other lead is likely to be pressed. In this case, if the principal surfaces of the protrusion and the lead protrusion would be made of the same base material (for example, copper) as is the lead frame, the heights of the protrusion and the lead protrusion would be unequal to the height of the other lead which is plated with the metal, and the clamping by the damper would be insufficient.

The present embodiment enables the protrusion of the island and the lead protrusion to be securely clamped even in the case where the position of being pressed by the projecting portion deviates toward the other lead, because the protrusion and the lead protrusion are provided with their own metal plated layers each having the same film thickness as does the metal plated layer of the other lead.

The manufacturing method of the present invention can be provided as a method of manufacturing a semiconductor device, whereby the metal ribbon is capable of being fixedly bonded by preventing the island from being lifted up even in the case where no hanging pin or no clamp area around the island is provided, because (the protrusion of) the island and (the lead protrusion of) the lead are clamped by the projecting portion of the damper at the same time.

What is claimed is:

1. A semiconductor device comprising:
   a semiconductor element comprising an electrode disposed on a principal surface of the semiconductor element;
   an island to which the semiconductor element is attached;
   a first lead separated from the island so that, in plan view of the semiconductor device, an edge of the first lead faces an edge of the island;
   a first protrusion that, in the plan view, is contiguous with and protrudes from the edge of the island toward an extrapolation of the edge of the first lead; and
   a metal ribbon comprising a first end attached to the electrode of the semiconductor element and a second end attached to the first lead.

2. The semiconductor device of claim 1, wherein, in the plan view, the first protrusion extends beyond the extrapolation of the edge of the first lead.

3. The semiconductor device of claim 2, further comprising a metal plated layer disposed on at least the first protrusion and part of the first lead near the edge of the first lead.

4. The semiconductor device of claim 1, further comprising a second protrusion protruding from the first lead toward the first protrusion along the extrapolation of the edge of the first lead.

5. The semiconductor device of claim 1, further comprising a second lead disposed adjacent the first lead and separated from the island so that, in the plan view, an edge of the second lead faces an edge of the first protrusion.

6. The semiconductor device of claim 1, further comprising another metal ribbon, another first lead to which the another metal ribbon is attached, and another first protrusion corresponding to the different metal ribbon.

\* \* \* \* \*